United States Patent [19]

Phillips et al.

[11] Patent Number: 5,052,006
[45] Date of Patent: Sep. 24, 1991

[54] SCANNER BEAM SEMICONDUCTOR SWITCHING APPARATUS

[75] Inventors: Chester C. Phillips, Columbia, Md.; Shiow-Hwa Lin, San Diego, Calif.

[73] Assignee: Thermo Electron Technologies Corp., San Diego, Calif.

[21] Appl. No.: 571,493

[22] Filed: Aug. 23, 1990

Related U.S. Application Data

[63] Continuation-in-part of Ser. No. 452,002, Dec. 18, 1990.

[51] Int. Cl.$^5$ .............................................. H01S 3/19
[52] U.S. Cl. ........................................ 372/44; 372/45; 372/50
[58] Field of Search ..................................... 378/43–46

[56] References Cited

U.S. PATENT DOCUMENTS

| | | | |
|---|---|---|---|
| 4,809,290 | 2/1989 | White et al. | 372/44 |
| 4,940,303 | 7/1990 | Abeles et al. | 372/50 |
| 4,948,960 | 8/1990 | Simms et al. | 372/45 |

OTHER PUBLICATIONS

Optics Letters, Mar. 15, 1990/vol. 15, No. 6, pp. 323–326, Darrow et al.

Primary Examiner—Léon Scott, Jr.
Attorney, Agent, or Firm—John R. Ross

[57] ABSTRACT

A beam of radiation radiates in sequence an array of semi-conductor switches at an extremely rapid rate. Electron-hole pairs created by radiation permit the semiconductor switches to conduct electric current for a very brief period of time.

8 Claims, 9 Drawing Sheets

SCANNER BEAM SEMICONDUCTOR SWITCHING APPARATUS

This invention relates to semiconductor switches and is particular to very high speed switches. This invention is a continuation-in-part of U.S. patent application Ser. No. 0452002 filed 12/18/89.

BACKGROUND OF THE INVENTION

It is known that a diamond chip and certain other insulators and certain semiconductors can be made to conduct electricity through bombardment with an electron beam or laser radiation and become an insulator soon after the bombardment stops. The time between the termination of the bombardment and the change in the property of the material from conductor to insulator is measured by a parameter known as the "free carrier lifetime". In some materials this time is extremely short. For example, the free carrier lifetime for radiation-damaged silicon-on-sapphire is 0.6 pico seconds. (See Darrow et al, "Optics Letters", Vol. 15, No. 6, Mar., 15, 1990.)

It is well known that an electron beam can be forced to trace out various paths including an elipsoidal path on a surface generally perpendicular to the beam by subjecting the beam to a varying the electric field.

SUMMARY OF THE INVENTION

The present invention provides a high speed semiconductor switching apparatus. A beam of radiation radiates in sequence an array of semi-conductor switches at an extremely rapid rate. Electron-hole pairs created by the radiation permit the semiconductor switches to conduct electric current in sequences for a very brief period of time.

DETAILED DESCRIPTION OF PREFERRED EMBODIMENT

The present invention can be described by reference to the figures.

COMMUTING SWITCH

Figure 1:
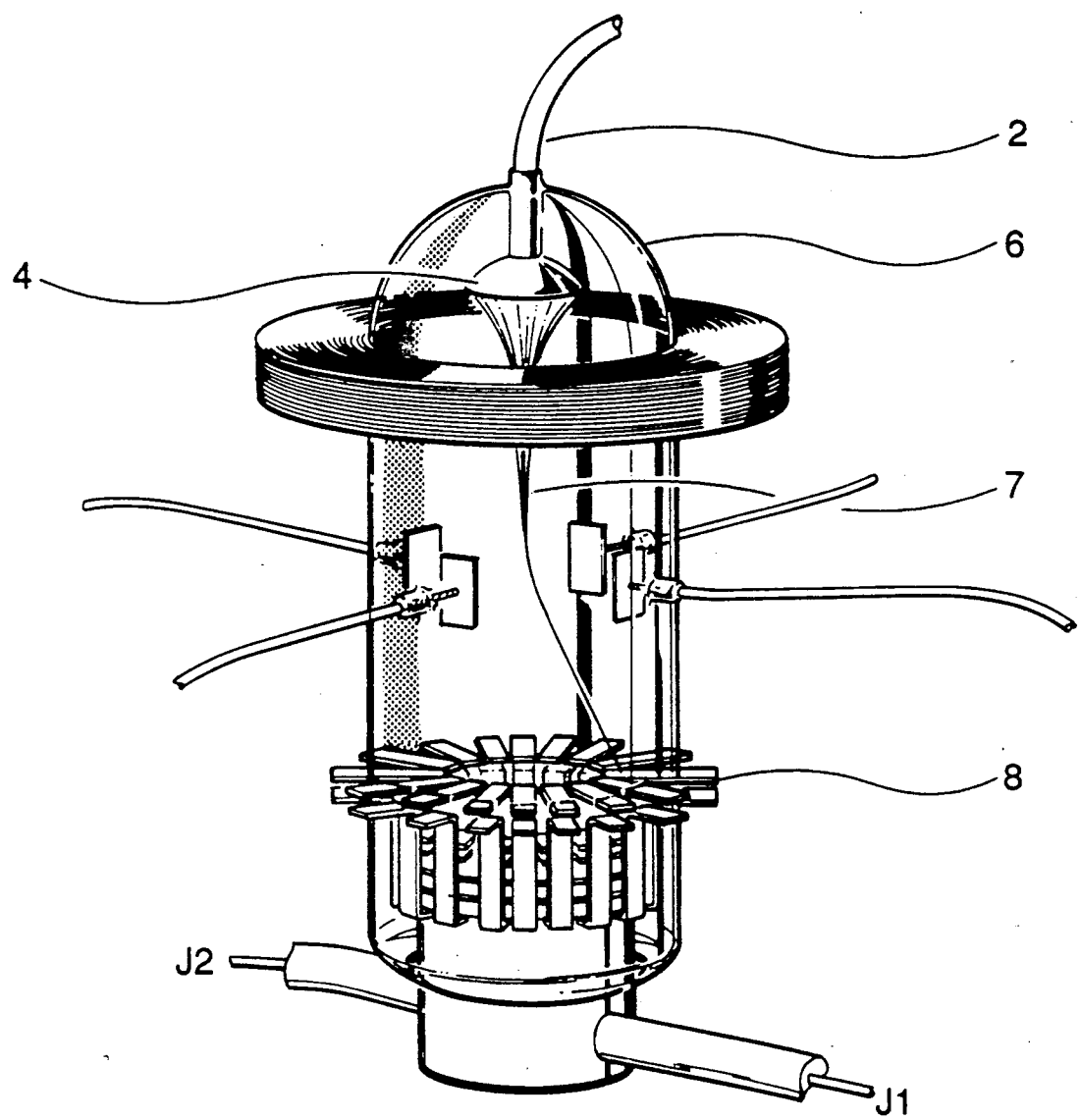
FIG. 1 is a perspective drawing showing a preferred embodiment of the present invention.

A preferred embodiment of the present invention useful for performing analog to digital conversions is shown in FIG. 1. Glass vacuum tube 2 contains cathode 4 which is located near the top of the tube. Cathode 4 is charged by high voltage feed through line 6 and is the source of electron beam 7 directed at anode target assembly 8. Anode target assembly 8 which is located near the bottom of the tube.

Figure 2:
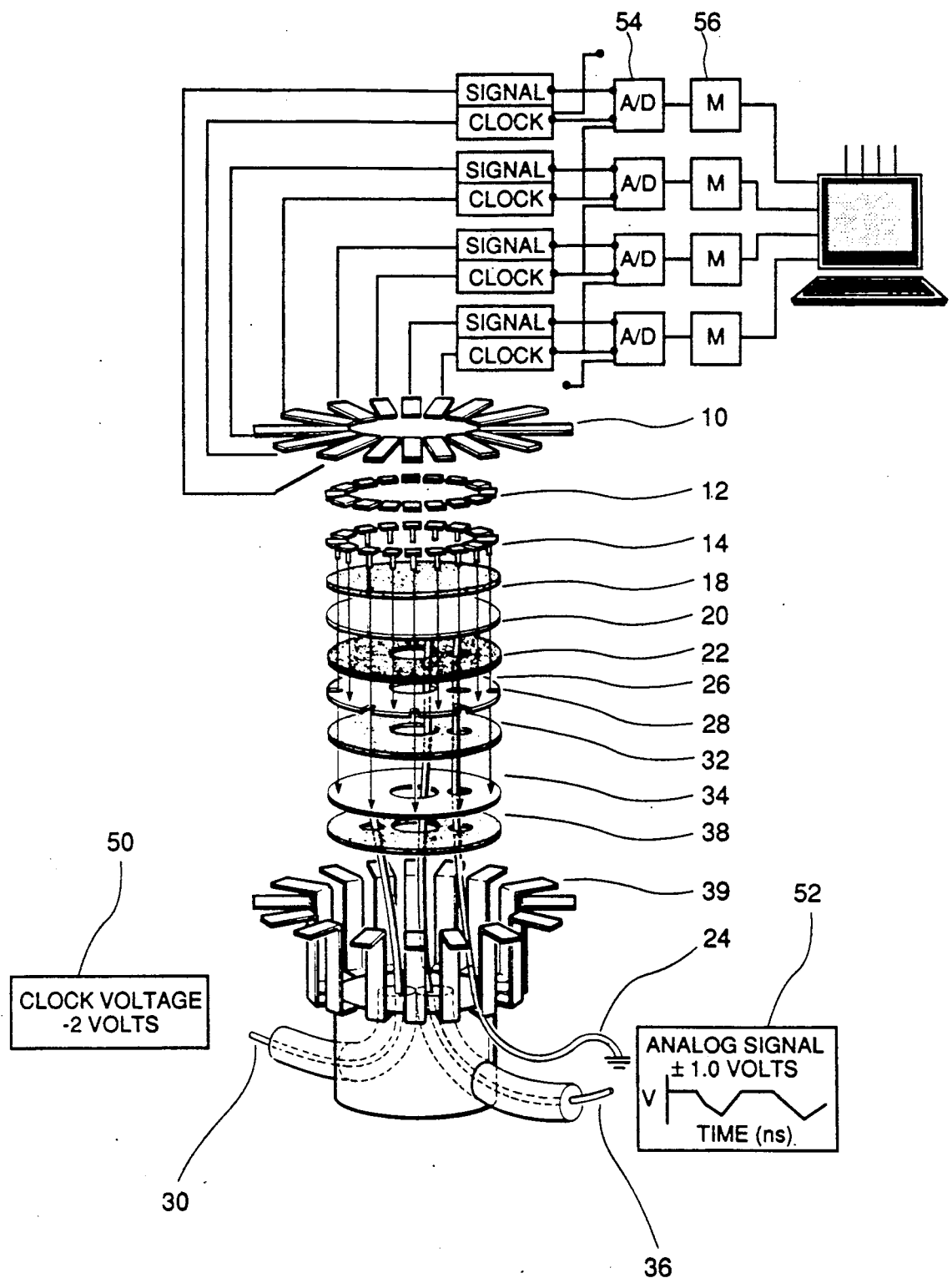
FIG. 2 is a blow-up of a portion of the embodiment shown in FIG. 1.

A blow up of anode target assembly 8 is shown in FIG. 2. It is made up of:
sixteen upper switch leads, 10;
radiation-damaged silicon-on-sapphire chips, 12;
sixteen lower switch leads, 14;
a first insulating layer, 18;
a ground plane anode surface, 20;
which is connected to ground through a grounding cable 22 as indicated at 24;
a second insulating layer 26;
a clock distribution surface 28,
which is electrically connected to a clock voltage source cable 30;
a third insulating layer 32;
a signal distribution surface 34,
which is electrically connected to a signal cable 36;
a fourth insulating layer 38; and
ground wire surfaces 39.

Leads 10 and 14 and distribution surface 5 are preferably copper. The insulating layers 18, 26, 32 and 38 are preferable alumina and upper switch leads 10 are preferably very thin over at least a portion of chips 12 so that a large portion of the electrons from beam 7 will pass through leads 10 into chips 12. Chips 12 are each approximately $2\mu \times 2\mu \times 0.5\mu$.

Beam 7 is focused approximately at the surface of chips 12 by focus coil 40. Reflection plates 41, 42, 43, and 44 are charged so as to generate orthogonial sine and cosine voltage fields which cause the electron beam 7 trace out a circular path across the sixteen chips 12.

As beam 7 passes through chips 12, beam 7 creates an abundance of electrons and hole pairs which permits the chips to conduct current from sources 52 and 50 to A/D converter unit 54. Since there is a large excess of electron and hole pairs the current flow is approximately proportional to the source voltages. After the beam passes a chip the electrons and holes remaining in the chip continue to be swept out of the chip or combine with each other over a period of about 0.5 pico seconds.

In our preferred embodiment a beam current of about 0.1 amps is generated by a cathode voltage of about 500 volts. The voltage on the deflection plates varies up to about 20 volts with a frequency in the range of about 100 million cycles per second. As shown in FIG. 2, the clock cable 30 is electrically connected to a clock voltage source 50 of −2 volts DC. Signal cable 36 is electrically connected to a signal source 52 which typically will be an analog signal fluctuating in the range of about ±1 volt. Eight of the sixteen lower switch leads 14 (i.e., alternate leads) are connected to signal distribution surface 34. The connections are made such that around the circle of leads every other lead is connected to the signal source. The other eight lower switch leads 14 are similarly connected to clock distribution surface 28. Corresponding upper lead (clock and signal samples) 10 are connected to A/D converter unit 54. A/D Converter Unit Model AD9016, available from Analog Devices Corporation of Norwood, Mass. is suitable for this embodiment and memory devices available from many suppliers would be suitable. For many uses the computer could be an ordinary PC also available from any one of many suppliers.

Figure 3:
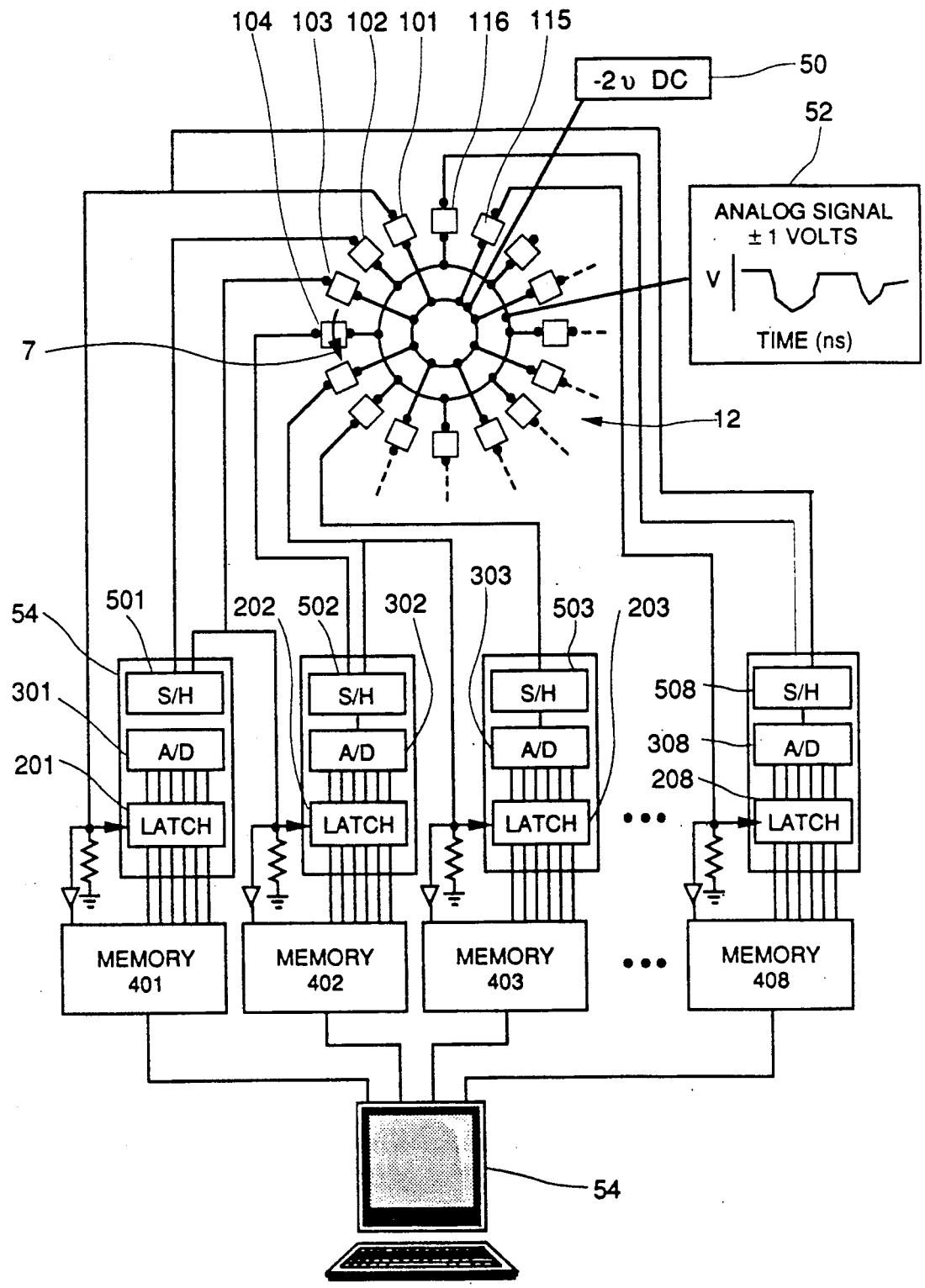
FIG. 3 is a block diagram showing in greater detail the electrical portion of an embodiment of the present invention.

Operation of this preferred embodiment can be explained by reference to FIG. 3. The sixteen radiation damaged silicon-on-sapphire chips 101, 102, 103, 104 . . . 115, and 116 are shown in a circular array. They function as switches, each of which is closed when electron beam 7 is passing through it and open very soon after electron beam 7 ceases passing through it.

In this preferred embodiment, electron beam 7 rotates around the diamond array at 100 million cycles per second and sequentially closes the "switches" one at a time. At this rate, the complete scanning process is repeated every 10 nanoseconds with new samples of the signal taken each scan. The switches open about 0.6 pico seconds after the beam passes the chip. The beam is on the chip for about 0.3 nanosecond. Thus, the switches are closed for a little longer than about 0.3 nanoseconds. For example, as beam 7 passes through chip 102 which is connected to signal voltage source 52, the analog signal from source 52 is connected to A/D converter 301 for a period of roughly ⅓ nanosecond. In this time period, the sample is held and the A/O converters are actively adjusting to measure the sample.

About 0.6 ns after passing over chip 102 beam 7 passes to chip 103 which is connected to clock voltage source 50. Current from source 50 causes latch 202 to latch into computer memory unit 402 a 6-word digital that has previously been measured by A/D converter 302.

The beam then passes to chip 104 which is connected to analog signal source 52 and a new 6-digit word is stored in A/D converter 302.

The beam passes around the chip array to chip 101 which provides current to latch 201 and permits the reading into computer memory 401 the 6-word digital signal which had previously been stored in A/D converter 301. The beam then proceeds around the array again to chip 102 and the process repeats at the rate of 100,000,000 cycles per second.

Computer 54 is connected to each of memory units 401–408 and can be programmed to analyze the data on an almost real time basis or it can be programmed to control the storage of the information so that it can be analyzed later on. Also computer 54 can be programmed to add memory units or for the transfer of the information to other systems to avoid overflow situations.

With the electron beam rotating at 100,000,000 cycles per second in this preferred embodiment, analog to digital conversion of 800,000,000 digital words per second can be obtained.

Of course, we are not limited to sixteen chips or this rotation speed. Other combinations can be arranged using existing technology to achieve switching rates in the range of 100 million switches per second to more than 32 billion switches per second. For example, a beam rotation of 200,000,000 cycles and 160 chips would lead to a conversion of 16 billion words per second. Making the chips smaller will reduce the length of time required for the electron hole pairs to recombine and allow higher speed operation. For relatively low voltage high speed devices, radiation-damaged silicon-on-sapphire chips are recommended. For much higher voltages diamond chips are preferable. Many other semiconductor materials such as GaAs, InP, Polysilicon and CdTe could also be used.

ONE CHIP COMMUTING SWITCH

Figure 4:
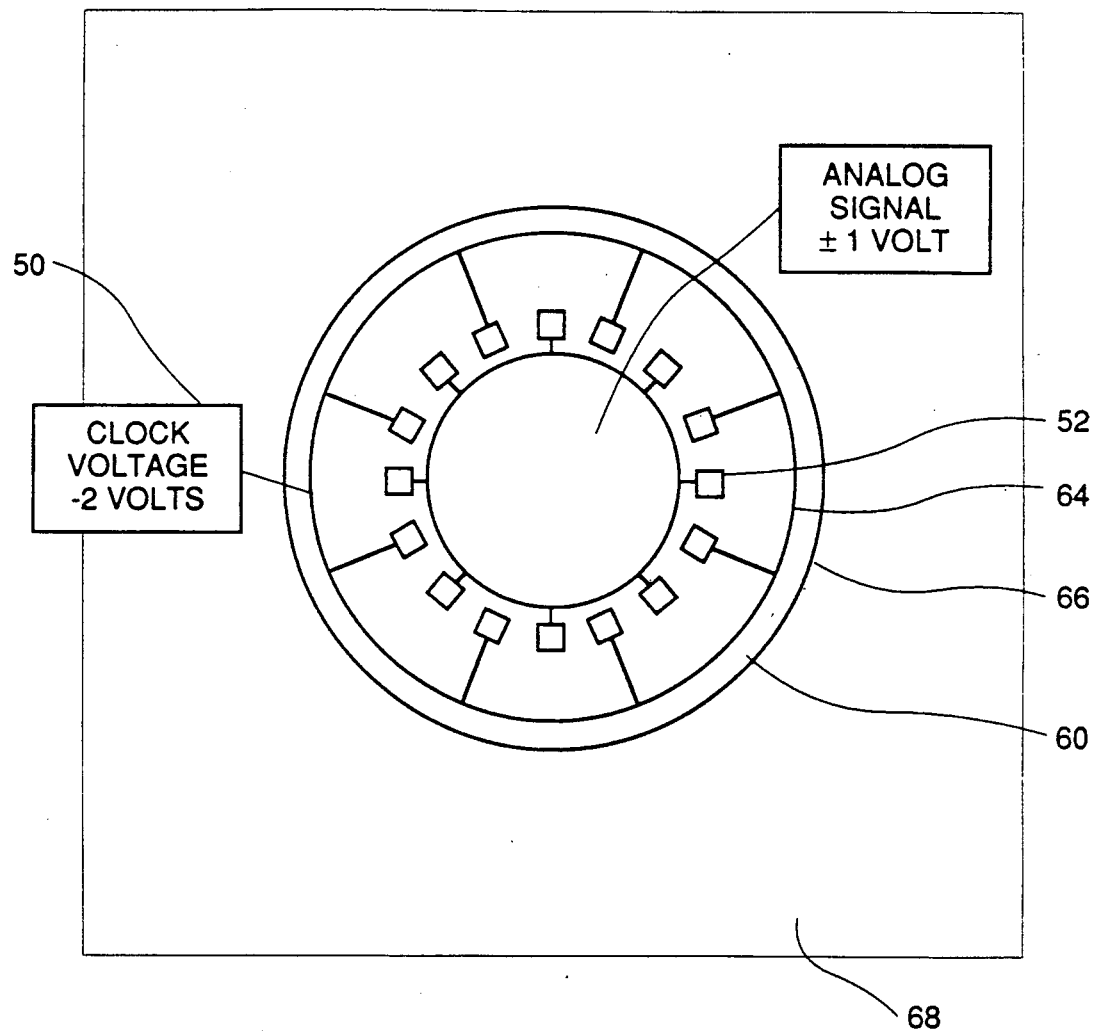
FIG. 4 is the bottom view of a diamond chip with leads deposited on it.
Figure 5:
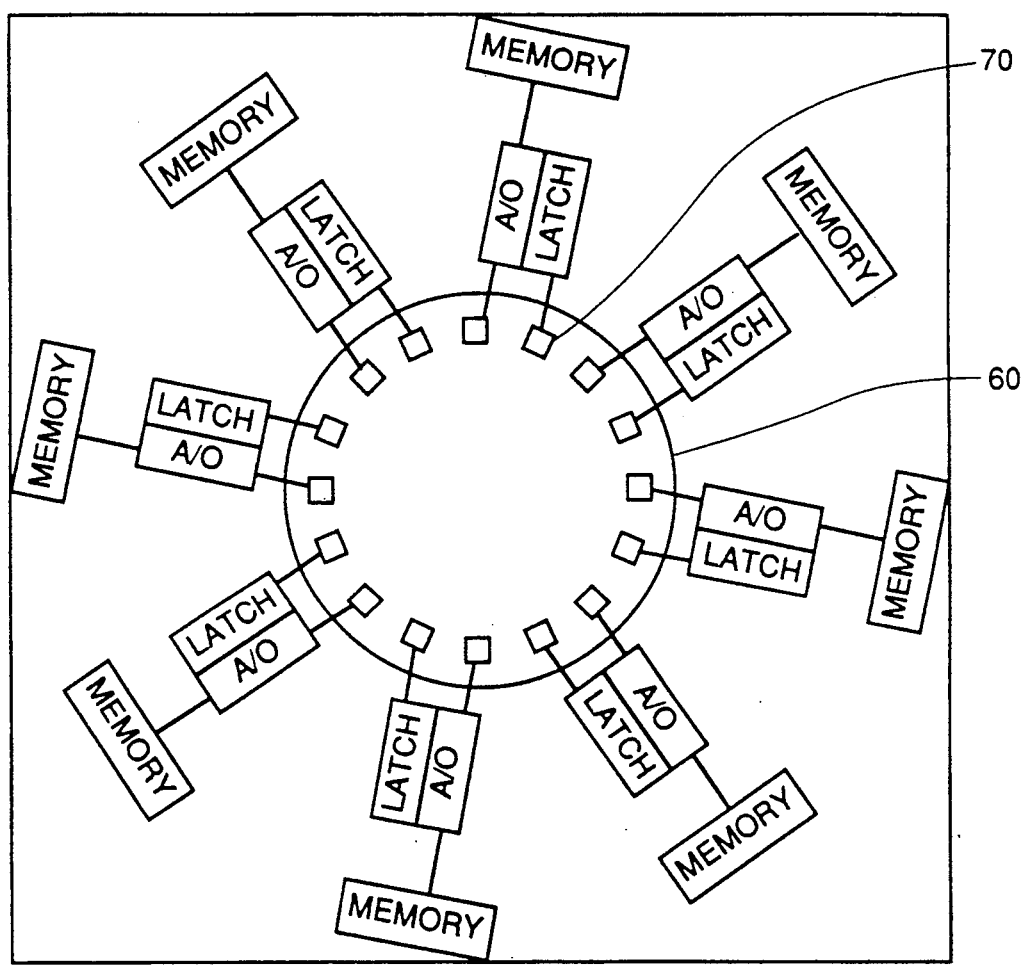
FIG. 5 is the top view of the chip shown in FIG. 4.

Another embodiment of the present invention is demonstrated by reference to FIGS. 4 and 5. This embodiment is essentially the same as that shown in FIG. 1 except only one chip 60 is used. FIG. 4 is the bottom view of the chip. On the bottom of the chip an analog signal distribution plate 62 made of copper is vapor deposited on the chip along with sixteen cover leads 64 and a clock voltage distribution ring 66 all of which are copper. Alternate lower leads are connected to the plate 62 and ring 66 as shown in FIG. 4. The ring 66 is connected to clock voltage 50 and plate 62 is connected to analog signal source 52. The chip is mounted on board 68.

FIG. 5 is the top view. Here sixteen copper upper leads 70 are deposited on the chip 60 above corresponding lower leads 64. As in the previous embodiment these leads are very thin (about 3 to 5μ) so that most of the electrons of an electron beam can pass through the leads to the chip. The remainder of this embodiment is similar to the one described above. And the operation of it is essentially the same as for the embodiment described above.

FROZEN WAVE GENERATOR

Figure 6:
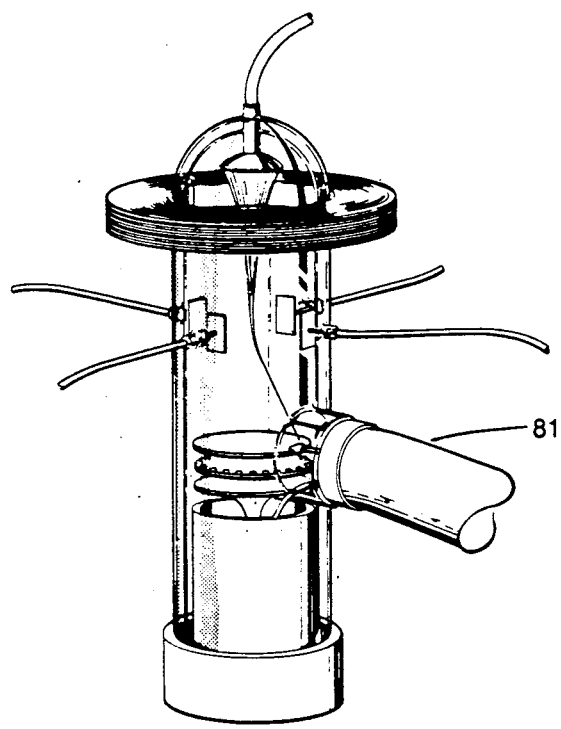
FIG. 6 is a perspective drawing of a frozen wave generator.
Figure 7:
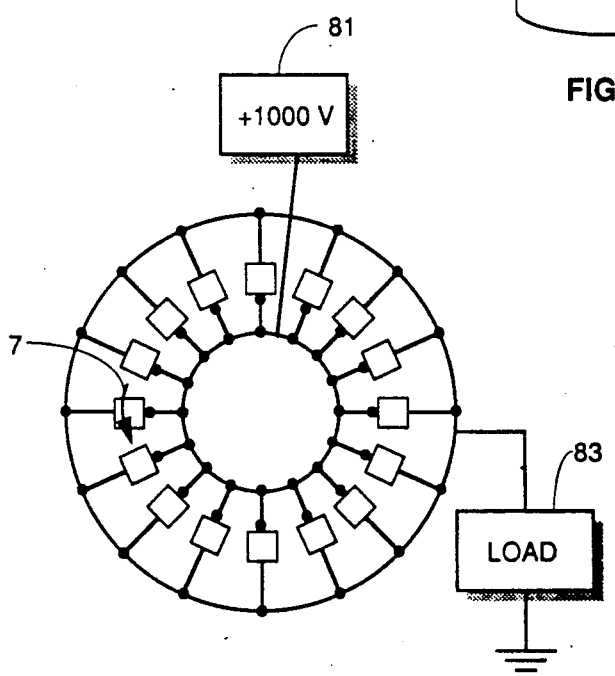
FIG. 7 is a block schematic drawing showing the electrical part of the generator shown in FIG. 6.
Figure 8:
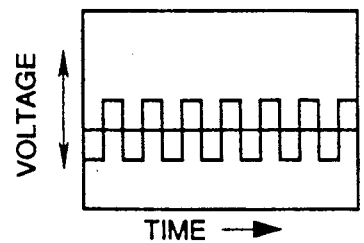
FIG. 8 is a sketch of the output voltage of the frozen wave generator shown in FIG. 6.

Another embodiment of the present invention can be described by reference to FIGS. 6 and 7. This embodiment is useful to produce a continuous wave electrical output. The difference between this embodiment and the one shown in FIG. 1 are as follows: In this case the sixteen upper leads are attached to a high voltage sources 81 which may for example be at +1000 volts as shown in FIG. 7. As electron beam 7 passes through chip 12 and successive chips in the chip array at 200,000,000 cycles per second an output as sketched in FIG. 8 is produced across lead 83. The fundamental component of the output is the product of the scanning frequency times the number of chips in array. With an embodiment of 16 chips scanned at 200,000,000 cycles per second, the fundamental frequency component of the output is 3,200,000,000 cycles per second (3,200 MHz).

Figure 9:
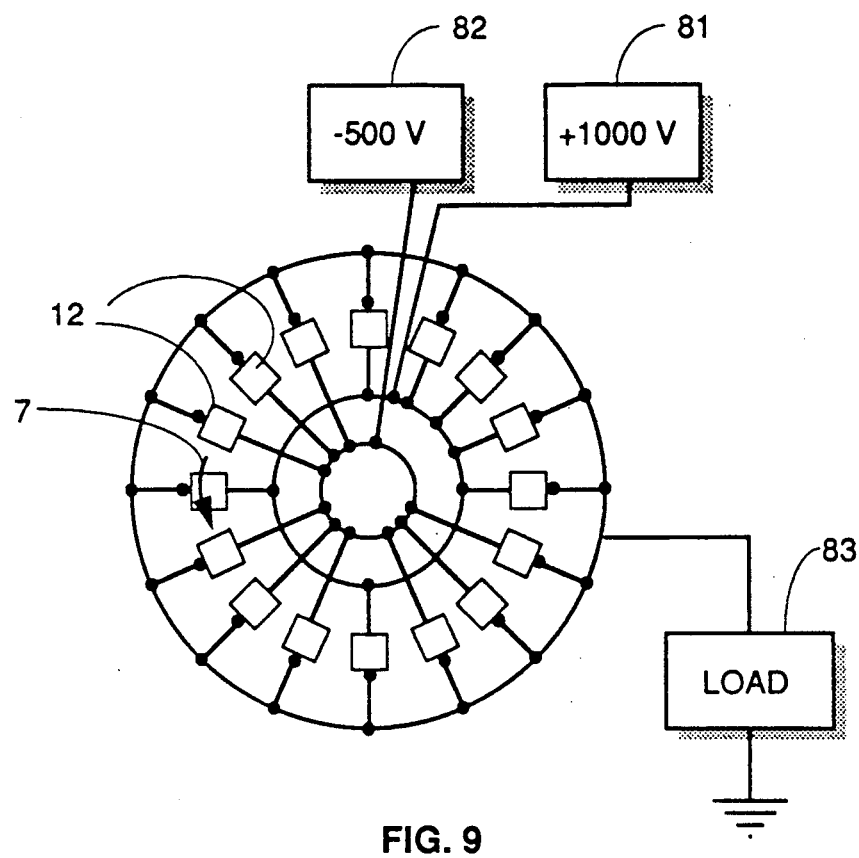
FIG. 9 shows an alternate electrical arrangement to obtain a different wave form.
Figure 10:
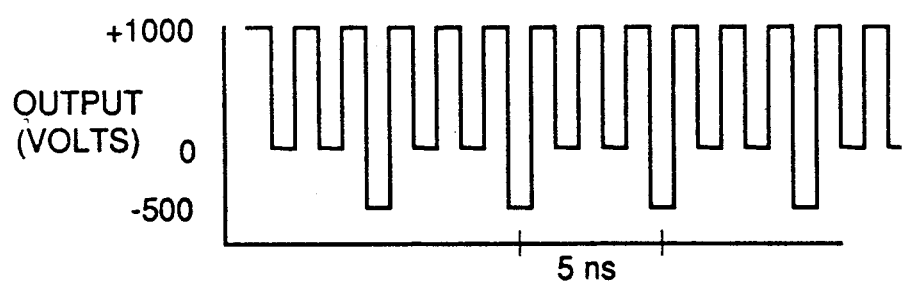
FIG. 10 is a wave form produced by the arrangement shown in FIG. 9.

More complicated wave forms can be generated using more than one high voltage source as indicated in FIGS. 9 and 10. In addition, more efficient frequency generation can be accomplished since the strong direct current component of the embodiment described in FIG. 8 can be eliminated by attaching alternate switch leads to opposite polarity voltages.

LIGHT OPERATED SWITCHES

This invention can also be practiced using a laser beam to operate the switches instead of the electron beam described above since a laser beam can be used to create the electron hole pairs.

LIGHT PIPES

Figure 11:
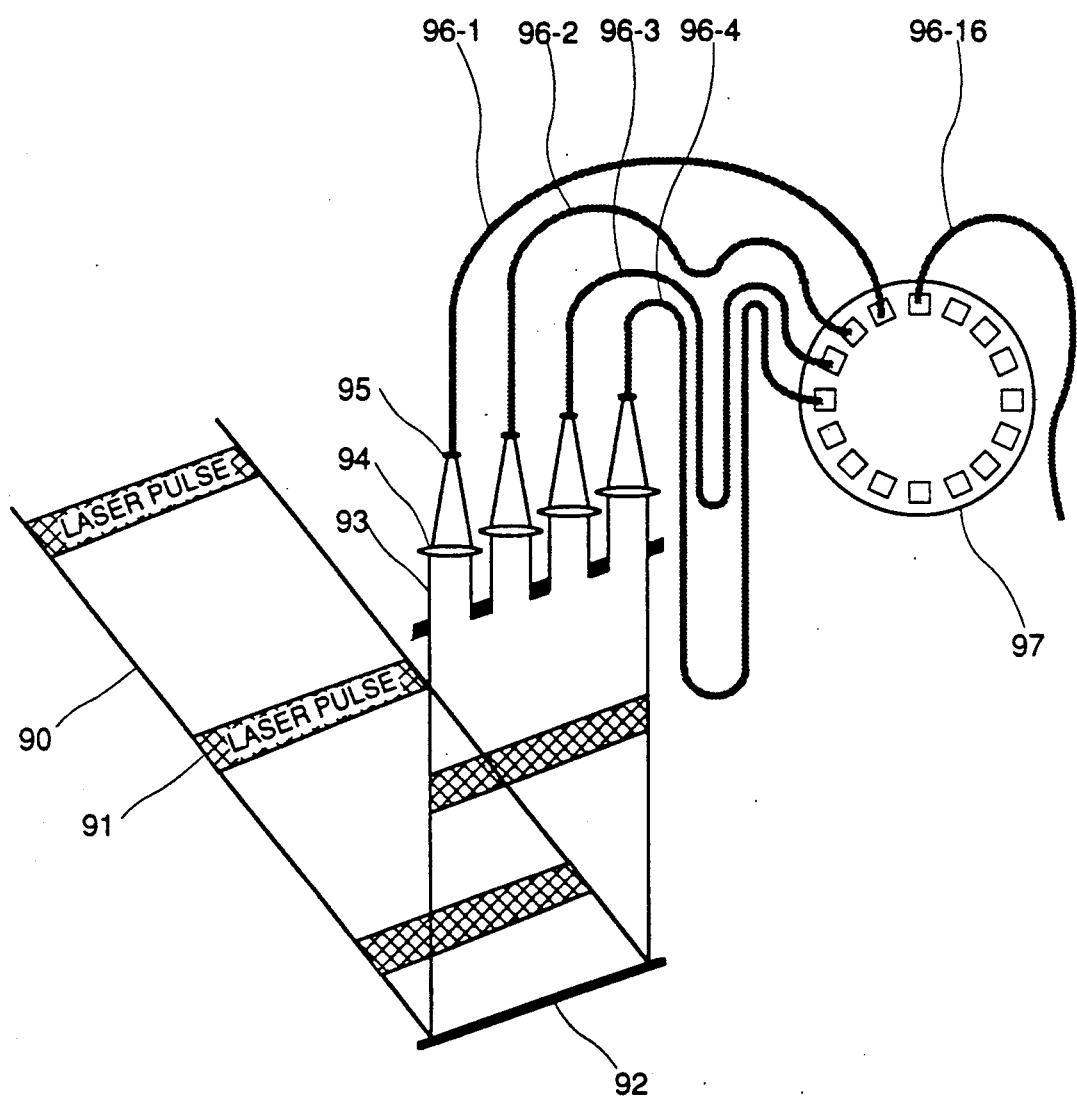
FIG. 11 is a sketch showing how in a preferred embodiment semi-conductor chips are radiated in sequence with laser pulses.

A preferred embodiment is shown in FIG. 11. A pulsed laser beam 90 comprised of laser pulses 91 is reflected off mirror 92 through sixteen separate apertures 93 (only 4 are shown in FIG. 11) to create sixteen separate beams. The sixteen beams are directed by lenses 94 and 95 into sixteen light pipes 96-1 through 96-16. The light pipes are of varying lengths such that the pulses in each pipe arrive at switch array 97 in a sequence such that 96-1 is first, 96-2 is second, 96-3 is third, 96-4 is fourth and 96-16 is last and after a pulse in 96-16 arrives, the next pulse from 96-1 is approaching to continue the sequence. For example, using a 200,000,000 pulse per second laser device (pulses every $5 \times 10^{-9}$ seconds) and a ⅛ nanosecond pulse length, the 16 light pipes can be made to sequentially illuminate 16 chips in a manner similar to the process described for the electron beam apparatus.

For the embodiment shown in FIG. 11, pulse laser devices similar to Model number 130-1047 marketed by Lightwave Electronics should be adequate. Light pipes are available from many suppliers and radiation damaged silicon-on-sapphire chips are commercially available either for use as several individual chips as shown in FIGS. 11 and 3 or as a single chip on which several leads are deposited as described above with regret to the diamond chip. Many other semi-conductor materials such as GaAs, diamond Ge, Si GaSb, InSb, In As or InP could be used in lieu of the radiation damaged silicon-on-sapphire chip but the free carrier lifetime for these other chips is typically longer. The length light pipes should be are as follows:

| Light Pipe | Length |
|---|---|
| 96A | L |
| 96B | L + 6.5 cm |
| 96C | L + 12.5 cm |
| 96D | L + 18.75 cm |
| 96O | L + 100 cm |

This would space the pulses approximately $0.3125 \times 10^{-9}$ seconds apart, since the speed of light in the light pipes is about $2 \times 10^{10}$ cm/sec. The 100 cm difference in lengths of the shortest and longest light pipe provides 5 ns total delay to match the laser pulses rate.

When using light pulses to trigger the semi-conductor switches, lead 10 shown in FIG. 2 over the chip 12 should preferably be in the form of a grid instead of a thin layer so that light can effectively pass through the grid to the semiconductor material.

ELECTRO-OPTIC PRISMS

Figure 12:
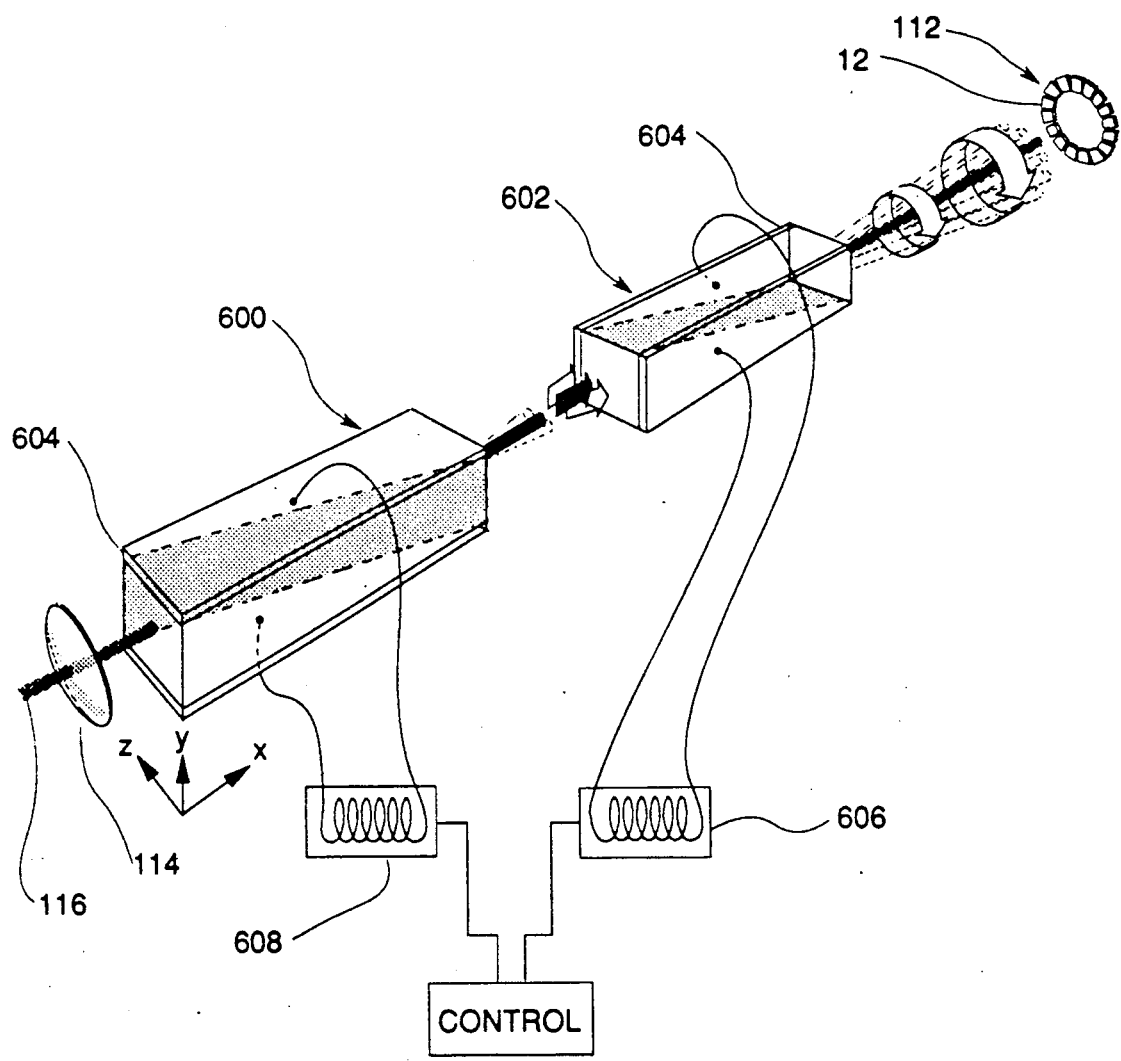
FIG. 12 is a sketch showing an alternate embodiment for irradiating the chips in sequence with laser radiation.

As shown in FIG. 12, laser radiation can be provided in a circular pattern across an array of chips as described for the electron beam shown in FIGS. 1-10 and described above. This is preferably accomplished using electro-optic prisms. Techniques for providing a beam mapping a circular path with these prisms is well known. For example, see Lee and Zook, "Light Beam Deflector with Electro-Optic Prisms", IEEE Journal of Quantum Electronics, Vol. QE-4, No. 7, July 1968. See especially pages 448 and 449 which are incorporated herein by reference.

Prism 600 and 602 are each constructed of two KDP (potassium dihydrogen phosphate) wedges, and each comprise electrodes 604 supplied by high voltage sources 605 and 608. These provide electric potentials fluctuating at 100 MHz which cause laser beam 110 to be deflected in the ± direction as it exits prism 600 and to describe a circle path in the XY plane as it exits prism 602. The beam is focused on target array 112 of the same 16 chips 12 discussed above by lens system 114 shown conceptually in FIG. 12. For a more detailed sketch of the lens system see FIG. 13 on page 449 of the Lee and Zook reference.

While the above description contains many specificities, the reader should not construe these as limitations on the scope of the invention but merely as exemplifications of preferred embodiments thereof. Those skilled in the art will envision many other possible variations within its scope. The scope of this invention is determined by the appended claims and their legal equivalents.

We claim:
1. A high speed semi-conductor switching apparatus comprising:
   a plurality of semi-conductor switches each of which is comprised of
      a first lead,
      a second lead and
      semi-conductor material separating said first lead and said second lead,
   a beam means for producing a beam of radiation for radiating said semi-conductor material to generate electron-hole pairs thereby permitting said switches to conduct electrical current closing electrically said switches,
   a beam directing means for directing said beam of radiation to said semi-conductor switches one at a time in a continuous sequence in order to achieve switching of said plurality of switches in sequence at a rapid rate.
2. A switching apparatus as in claim 1 wherein said beam of radiation is an electron beam.
3. A switching apparatus as in claim 2 wherein said semi-conductor material is material selected from the group consisting of radiation-damaged silicon-on-sapphire, InP, GaAs, polysilicon CdTe and diamond.
4. A switching apparatus as in claim 1 wherein said plurality of switches are arranged in a circular array.
5. A switching apparatus as in claim 1 and further comprising a plurality of analog-to-digital convertors which are controlled by said switches in order to perform analog-to-digital conversion at a rapid rate in excess of 100 million words per second.
6. A switching apparatus as in claim 1 wherein said beam is a laser beam.
7. A switching apparatus as in claim 6 wherein said beam is separated into a plurality of separated pulsed laser beams and each of said plurality of separate pulsed laser beams is directed along a different path such that the pulses in said separate beams arrive at said semi-conductor switches in sequence.
8. A switching apparatus as in claim 1 and further comprising an electrical load and at least one high voltage source; said apparatus, said load, and said at least one high voltage source being connected electrically so as to provide a rapidly fluctuating voltage to said load.

* * * * *